United States Patent
Miura

[11] Patent Number: 5,818,277
[45] Date of Patent: Oct. 6, 1998

[54] TEMPERATURE BALANCED CIRCUIT

[75] Inventor: Takeo Miura, Tatebayashi, Japan

[73] Assignee: Advantest Corporation, Tokyo, Japan

[21] Appl. No.: 790,228

[22] Filed: Jan. 28, 1997

[51] Int. Cl.$^6$ .................................................. H03H 11/26
[52] U.S. Cl. ......................... 327/262; 327/160; 327/265; 327/279; 327/513
[58] Field of Search .................................. 327/262, 265, 327/273, 276, 277, 279, 284, 286, 160, 161, 512, 513

[56] References Cited

U.S. PATENT DOCUMENTS 4,800,304  1/1989  Takeuchi .................................. 327/279
5,237,224  8/1993  Delisle et al. ........................... 327/279

FOREIGN PATENT DOCUMENTS 2-296410  12/1990  Japan .

*Primary Examiner*—Timothy P. Callahan
*Assistant Examiner*—Kenneth B. Wells
*Attorney, Agent, or Firm*—Staas & Halsey

[57] ABSTRACT

A temperature balanced circuit is provided which is capable of, in case a CMOS•IC is utilized as a delay circuit, giving a constant delay time to an input signal to the delay circuit even if the frequency of the input signal is varied. A delay circuit 11 and a dummy circuit 11 having the same construction as that of the delay circuit are provided in a CMOS•IC. There are provided a counter counting first pulse signals CP1 supplied to the delay circuit during a fixed time interval and arithmetic unit finding a difference between a count value of this counter and a predetermined value, and the same number of second pulse signals as the difference value found by the arithmetic unit is supplied to the dummy circuit, thereby to define to a constant value both the number of the first pulses and the number of the second pulses supplied to the CMOS•IC within a unit time interval, which results in uniformity of an amount of heat generated in the CMOS•IC.

7 Claims, 2 Drawing Sheets

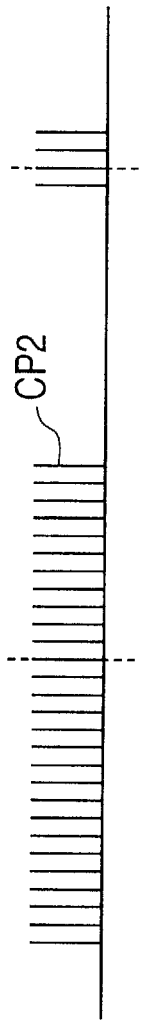
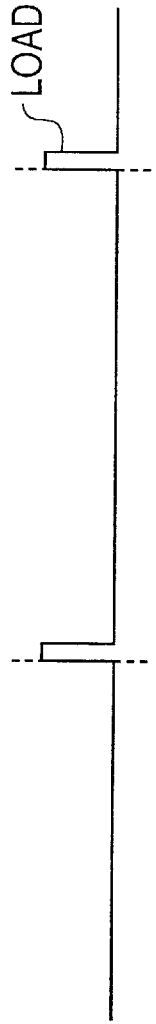
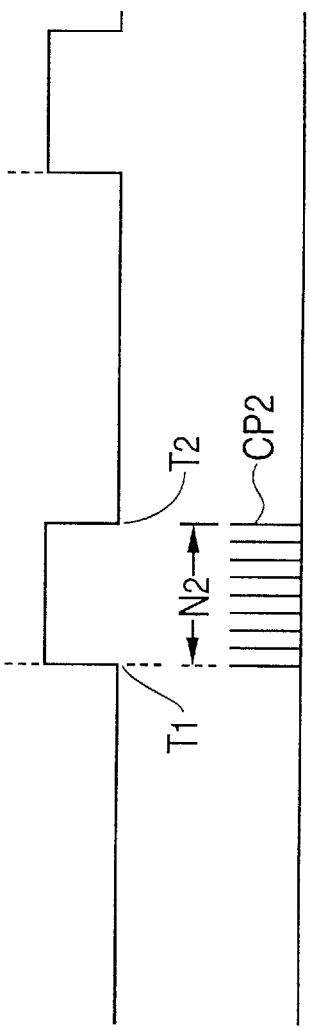
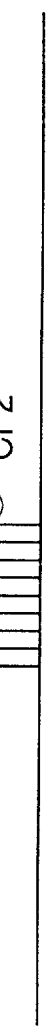
FIG. 2A
FIG. 2B
FIG. 2C
FIG. 2D
FIG. 2E
FIG. 2F

5,818,277

TEMPERATURE BALANCED CIRCUIT

TECHNICAL FIELD

The present invention relates to a temperature balanced circuit for use in balancing an amount of power consumption of a circuit formed as a semiconductor integrated circuit (IC) such as, for example, a CMOS (complementary MOS) structure semiconductor integrated circuit (CMOS•IC) thereby holding the temperature in the IC in a constant value.

BACKGROUND OF THE RELATED ART

A memory testing apparatus for testing a memory consisting of an IC generates a clock signal (pulse) delayed by a predetermined time interval from a reference timing signal (pulse), for the purpose of defining a timing of a test, produces a test pattern signal at the timing of this clock pulse, and applies this test pattern signal to a memory under test to perform the test.

In general, as a delay circuit for giving a delay time to the reference timing pulse are used a step-by-step variable type delay circuit which can switch a delay time step by step by utilizing a pulse interval between two adjacent clock pulses as a delay unit and a fine delay circuit which can provide a fine delay time shorter than the pulse interval of the clock pulse, that is, which is a fraction of the pulse interval. This delay circuit is arranged such that an arbitrary delay time can be provided by the combination of a delay time of the step-by-step variable type delay circuit and a delay time of the fine delay circuit. The present invention is directed to an improvement of the latter fine delay circuit.

The fine delay circuit of this kind generally utilizes a series of active elements formed as a CMOS•IC. The reason why a CMOS•IC is utilized as a delay circuit is that the power consumption of a CMOS•IC is very small in the state that no signal is applied thereto and hence the amount of heat generated in the CMOS•IC or calorific value of the CMOS•IC can be suppressed to a small amount.

A delay circuit formed as a CMOS•IC gets into such a state that a power is consumed when a signal is inputted thereto and each active element begins on/off operation. The temperature in the IC goes up in proportion to the amount of power consumption. Therefore, there is a disadvantage in the delay circuit that a delay time of an input signal is varied with this temperature fluctuation. Particularly, the delay circuit has a shortcoming that the amount of power consumption increases as the frequency of the input signal to be delayed becomes high and hence the delay time varies accordingly.

SUMMARY OF THE INVENTION

It is an object of the invention to provide a temperature balanced circuit which can provide a constant delay time to an input signal supplied to the delay circuit even if the frequency of the input signal is varied.

It is another object of the present invention to provide a temperature balanced circuit by which, by providing a dummy circuit having a same arrangement as a delay circuit in the proximity of the delay circuit, the amount of power consumption in both circuits can be maintained in substantially constant even if the frequency of the input signal supplied to the delay circuit is changed.

In accordance with the present invention, the above objects can be achieved by provision of a temperature balanced circuit. The temperature balanced circuit of the present invention comprises a delay circuit supplied with a first pulse signal to be delayed; a first pulse supply path supplying the first pulse signal to the delay circuit; a counter counting the number of the first pulse signals supplied to the counter via the first pulse supply path during a constant time duration; an arithmetic unit finding a difference between the count value of the first pulse signals counted by the counter and a predetermined value; and a dummy circuit supplied with the same number of second pulses as the difference value found by the arithmetic unit and provided in the vicinity of the delay circuit, the dummy circuit having the same circuit construction as that of the delay circuit.

The above delay circuit is formed as a semiconductor integrated circuit such as a CMOS•IC and the frequency of the second pulse signal is selected to be equal to or higher than the highest frequency of the first pulse signal to be delayed. Further, the amount of power consumed in both of the delay circuit and the dummy circuit is maintained in a constant value even if the frequency of the first pulse signal to be delayed is varied.

Accordingly, with the temperature balanced circuit according to the present invention, since the number of the first pulse signals inputted to the delay circuit during a constant time duration is counted and the same number of the second pulse signals as the difference value between the counted value and a preset value is supplied to the dummy circuit, the amount of power consumption consumed in the entire temperature balanced circuit can be maintained in a constant value even if the frequency of the first pulse signal is varied. Consequently, even if the frequency of the first pulse signal to be delayed is varied, the delay time given to this first pulse signal can be held in a constant value.

BRIEF DESCRIPTION OF THE DRAWINGS

FIGS. 2A, 2B, 2C, 2D, 2E and 2F are waveforms for explaining the operation of the temperature balanced circuit of FIG. 1.

DESCRIPTION OF THE PREFERRED EMBODIMENT

Figure 1:
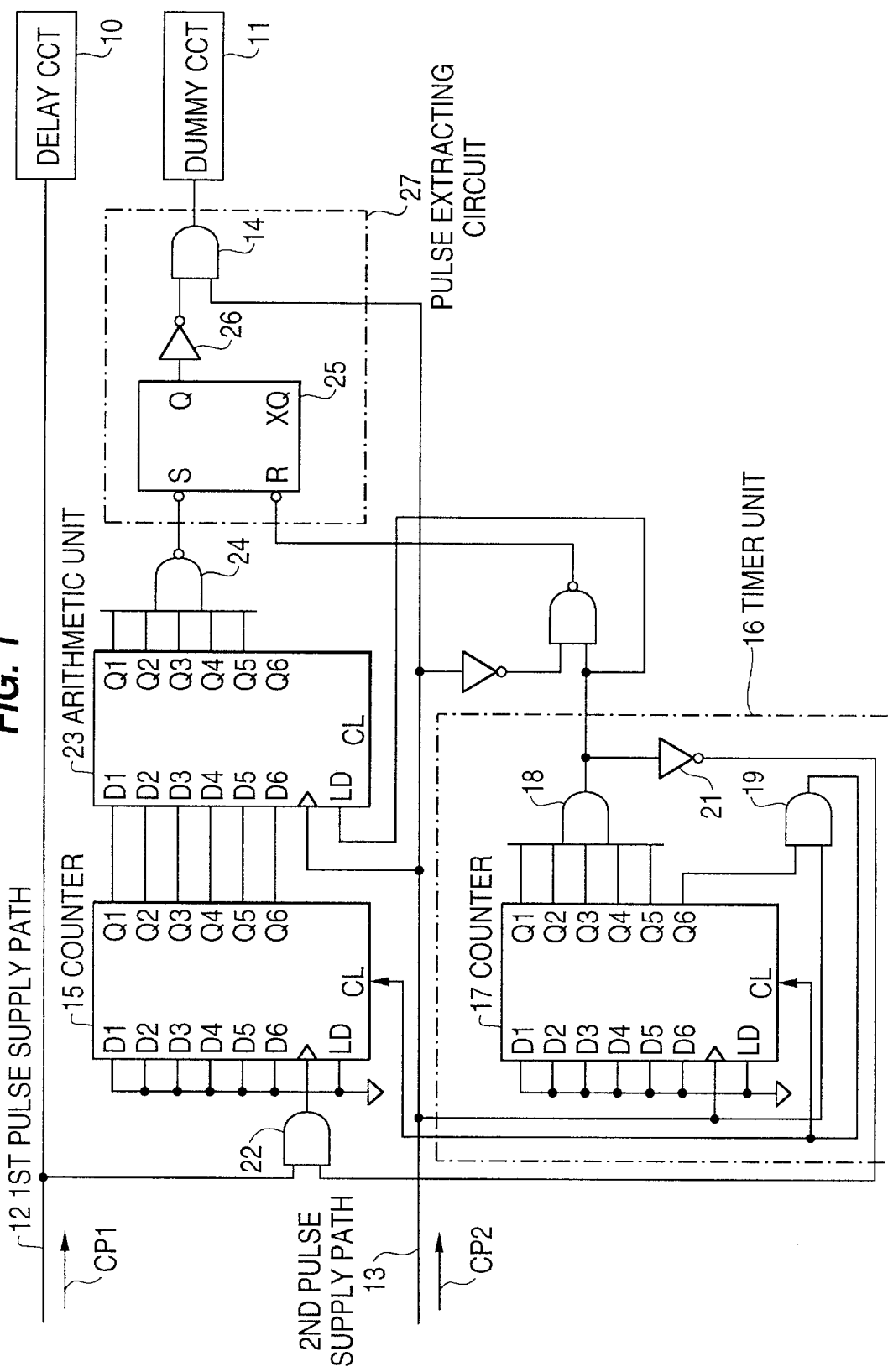
FIG. 1 is a block diagram showing an embodiment of a temperature balanced circuit according to the present invention.

FIG. 1 shows an embodiment of a temperature balanced circuit according to the present invention. This temperature balanced circuit includes a delay circuit 10 for giving a predetermined delay time to an input signal and a dummy circuit 11 provided in the vicinity of the delay circuit 10 and having the same circuit construction as that of the delay circuit 10. These delay circuit 10 and dummy circuit 11 are formed as a CMOS•IC. A first pulse supply path 12 is connected to the delay circuit 10 and a first pulse signal CP1 to be delayed is inputted to the delay circuit 10 via the first pulse supply path 12. A second pulse supply path 13 is connected to the dummy circuit 11 via an AND gate 14 of a pulse extracting circuit 27 to be discussed later, and second pulse signal CP2 is inputted to the dummy circuit 11 via the second pulse supply path 13 and the AND gate 14. The frequency $F_2$ of the second pulse signal CP2 supplied to the dummy circuit 11 is selected to be equal to or higher than the highest frequency $F_m$ of the first pulse signal CP1 supplied to the delay circuit 10. That is, $F_2 \geq F_m$. Further, hereinafter, a case in which the frequency $F_2$ of the second pulse signal CP2 is selected to be higher than the highest frequency $F_m$ of the first pulse signal CP1 will be described by way of example.

A counter 15 is connected to the first pulse supply path 12 via an AND gate 22. This counter 15 performs an operation of counting the first pulse signals CP1 inputted to the delay circuit 10 via the first pulse supply path 12 only during a predetermined fixed time interval. For this end, in this embodiment, a timer unit (time counting device) 16 is provided so that the timer unit 16 causes the counter 15 to perform a counting operation only during a fixed time interval. In this embodiment, the timer unit 16 comprises a counter 17 having an input terminal connected to the second pulse supply path 13 for counting a predetermined number of the second pulse signals CP2 supplied thereto via the second pulse supply path 13, AND gates 18 and 19 for detecting when the count value of the counter 17 reaches a predetermined value, and an invertor 21 for inverting in polarity the output signal of the AND gate 18 to output the inverted signal.

Specifically, five output terminals $Q_1$ to $Q_5$ of the counter 17 are connected to the inputs of the AND gate 18, respectively, and the remaining output terminal $Q_6$ of the counter 17 is connected to one input of the AND gate 19. The other input of the AND gate 19 is connected to the second pulse supply path 13 and the output of the AND gate 19 is connected to clock terminals CL of both the counters 15 and 17. In addition, the output of the AND gate 18 is connected to one input of the AND gate 22 through the invertor 21. Consequently, since the AND gate 18 outputs a logical high level (hereinafter referred to as H) signal only when all the five output terminals $Q_1$–$Q_5$ become H (this corresponds to 32 counts), the AND gate 18 detects that the count value of the counter 17 has reached 32. This detection output (H signal) of the AND gate 18 is supplied to one input terminal of the AND gate 22 connected to the input side of the counter 15 via the invertor 21. Since the other input terminal of the AND gate 22 is connected to the first pulse supply path 12, when the count value of the counter 17 reaches 32 counts, the output of the invertor 21 falls down to logical low level (hereinafter referred to as L) thereby controlling the AND gate 22 to be in the closed state. As a result, the counter 15 stops to perform the counting operation.

If the frequency $F_2$ of the second pulse signal CP2 is assumed to be always a constant frequency, the time interval that the counter 17 counts 32 second pulse signals CP2 is always constant. Therefore, the counter 15 always counts the first pulse signals CP1 for a constant time interval. Further, the construction of the timer unit 16 can be arbitrarily changed or altered.

The count value counted by the counter 15 is supplied to the arithmetic unit 23 located at the following stage. This arithmetic unit 23 operates to find a difference between the value counted by the counter 15 and a predetermined value, and to supply the difference signal to the pulse extracting circuit 27 located at the following stage via a NAND gate 24. The pulse extracting circuit 27 comprises a flip-flop 25, an invertor 26 and an AND gate 14, and operates to extract the same number of the second pulse signals CP2 as the difference value between the value counted by the counter 15 and the predetermined value and to input them to the dummy circuit 11.

As shown, in this embodiment, a presettable counter is utilized as the above arithmetic unit 23. The output signal from the AND gate 18 of the timer unit 16 is supplied to a load input terminal LD of the presettable counter and the second pulse signal CP2 is supplied to an input terminal of the presettable counter. Since the presettable counter has the five output terminals $Q_1$ to $Q_5$ connected to the input terminals of the NAND gate 24, respectively, when all the output terminals $Q_1$ to $Q_5$ of the presettable counter become H, it reaches the full count value (32 counts) like the counter 17 of the timer unit 16.

With such construction, when the count value of the counter 17 reaches 32 counts and the AND gate 18 outputs an H signal, the count value of the counter 15 is read in the arithmetic unit 23. The counter forming the arithmetic unit 23 remains, before the count value of the counter 15 is read therein, in the state that the counter has previously counted 32 second pulse signals CP2. This is, as mentioned above, because the frequency of the second pulse signal is higher than the frequency of the first pulse signal. Consequently, the NAND gate 24 remains in the state that it is outputting the L signal and the flip-flop 25 of the pulse extracting circuit 27 reads therein a polarity inverted signal, namely, H signal. As a result, the flip-flop 25 outputs an H signal from its Q output terminal. This H signal is inverted in polarity to an L signal by an invertor 26 and the L signal is supplied to the AND gate 14. Thus, the AND gate 14 is in a closed state.

On the other hand, when the arithmetic unit 23 reads therein the count value of the counter 15, the NAND gate 24 outputs an H signal because the count value of the counter 15 is smaller than 32 counts. Accordingly, the flip-flop 25 reads an L signal therein and outputs the L signal at its output terminal Q. Since this L signal output is inverted in polarity by the invertor 26, an H signal is supplied to the AND gate 14 so that the AND gate 14 is controlled to be in an open state.

As a result of the above operation, the AND gate 14 is controlled to be in an open state at the same time that the arithmetic unit 23 reads therein the count value of the counter 15, and hence the second pulse signals CP2 are supplied to the dummy circuit 11. In addition, the arithmetic unit 23 starts to count the second pulse signals CP2 from the count value of the counter 15 read therein (since this count value is smaller than 32). When the count value of the arithmetic unit 23 reaches its full count value (32 counts), i.e., when the arithmetic unit 23 ends with counting of the number of the second pulse signals corresponding to the difference value between the count value of the counter 15 and its own full count value (32 counts), the output of the NAND gate 24 becomes L and this L signal is read in the flip-flop 25 as an H signal. Therefore, the output of the invertor 26 falls down to L so that the AND gate 14 is controlled to be in the closed state.

Thus, as shown in FIG. 2E, the AND gate 14 gets into the open state from a time point Ti when the counter 17 has counted 32 second pulse signals CP2, thereby to start to supply the second pulse signal CP2 to the dummy circuit 11. The AND gate 14 is controlled to be in the closed state at a time point $T_2$ when the count value of the arithmetic unit 23 reaches the full count value, thereby to stop the supply of the second pulse signal CP2 to the dummy circuit 11. Therefore, in the illustrated embodiment, the flip-flop 25, the invertor 26 and the AND gate 26 constitute the pulse extracting circuit 27 for extracting the second pulse signal CP2.

Now, the present invention will be concretely described with reference to FIGS. 2A–2F. As is apparent from FIGS. 2A–2F, the frequency $F_2$ of the second pulse signal CP2 shown in FIG. 2B is set to a higher frequency than the highest frequency $F_m$ of the first pulse signal CP1 shown in FIG. 2A. That is, $F_m < F_2$. Assuming the number of the first pulse signals CP1 counted by the counter 15 is $N_1$ (FIG. 2A) and the number of the second pulse signals CP2 supplied to the dummy circuit 11 via the AND gate 14 is $N_2$ (FIG. 2F), the sum of $N_1$ and $N_2$ is always 32 as discussed above, i.e., $N_1 + N_2 = 32$.

This relationship is maintained even if the frequency of the first pulse signal CP1 is varied so that for every period, the number of the second pulse signals CP2 which corresponds to the result of subtraction of the count value of the first pulse signals CP1 from the predetermined value (the full count value of the arithmetic unit 23) are supplied to the dummy circuit 11. Therefore, taking an average, the amount of heat generated in both the delay circuit 10 and the dummy circuit 11 formed as one CMOS•IC, i.e., the amount of heat generated in the CMOS•IC having both circuits formed therein can be held in a constant value.

Further, a signal LOAD shown in FIG. 2C is a load signal supplied to the arithmetic unit 23 from the AND gate 18 when the counter 17 reaches its full count value, and a signal CLEAR shown in FIG. 2D is a clear signal supplied to the respective clear input terminals CL of the counters 15 and 17 from the AND gate 19.

In the embodiment described above, though the delay circuit and the dummy circuit are formed as one CMOS•IC, it is needless to say that the present invention can be also applied to a case in which the delay circuit and the dummy circuit are formed as one integrated circuit other than a CMOS•IC and similar function and effects can be obtained from such case, too.

As discussed above, according to the present invention, the temperature balanced circuit is arranged such that the counter 15 counts the number of the first pulse signals CP1 supplied to the delay circuit within a fixed time duration, and the number $N_2$ of the second pulse signals CP2 which corresponds to the result of subtraction of the count value $N_1$ counted by the counter 15 from the predetermined value (the full count value of the counter in the arithmetic means 23) are supplied to the dummy circuit 11. Therefore, the total number of the pulses supplied to both of the delay circuit 10 and the dummy circuit 11 can be held in a constant value. This relationship is maintained even if the frequency of the first pulse signal CP1 is varied. Consequently, the amount of heat generated in a semiconductor integrated circuit in which the delay circuit 10 and the dummy circuit are formed such as a CMOS•IC can be held in a constant value even if the frequency of the signal inputted to the delay circuit 10 is varied, resulting in a benefit that the delay time of the delay circuit 10 can be maintained in a constant value even if the frequency of the first pulse signal CP1 is varied.

What is claimed is:

1. A temperature balanced circuit comprising:
    a delay circuit giving a predetermined delay time to an input signal and outputting the delayed signal;
    a first pulse supply path connected to said delay circuit and supplying a first pulse signal to be delayed to said delay circuit;
    a second pulse supply path supplying a second pulse signal having a frequency equal to or higher than that of the first pulse signal supplied from said first pulse supply path;
    a counter counting the number of said first pulse signals within a predetermined fixed time interval;
    arithmetic means for finding a difference value between a count value of said counter and a predetermined value;
    pulse extracting means, coupled to the arithmetic means, for taking out the same number of the second pulse signals as said difference value found by said arithmetic means; and
    a dummy circuit supplied with the second pulses taken out by said pulse extracting means and provided near said delay circuit, said dummy circuit having the same construction as that of said delay circuit.

2. The temperature balanced circuit according to claim 1, wherein said arithmetic means comprises a presettable counter which operates to find a difference between a full counter value of the presettable counter and the count value of said counter read from said counter.

3. The temperature balanced circuit according to claim 1 wherein said delay circuit and said dummy circuit are formed as one semiconductor integrated circuit.

4. The temperature balanced circuit according to claim 3 wherein said semiconductor integrated circuit is a CMOS•IC.

5. The temperature balanced circuit according to claim 1, further comprising timer means for controlling the counter such that said counter counts the first pulse signals for a constant time interval.

6. The temperature balanced circuit according to claim 5, wherein said timer means comprises:
    a second counter connected to said second pulse supply path; and
    a logic circuit logically controlling the output of said second counter, and wherein said timer means causes said counter counting the first pulse signals to perform a counting operation during the constant time interval from the time that said counter of said timer means connected to said second pulse supply path starts to count the second pulse signals to the time that said counter of said timer means connected to said second pulse supply path reaches its full count value.

7. The temperature balanced circuit according to claim 5, wherein said timer means comprises:
    a counter connected to said second pulse supply path; and
    a logic circuit logically controlling the output of said counter of said timer means, and
    wherein the count value of said counter counting the first pulse signals is received in said arithmetic means when said counter of said timer means connected to said second pulse supply path reaches its full count value.

* * * * *

UNITED STATES PATENT AND TRADEMARK OFFICE
CERTIFICATE OF CORRECTION

PATENT NO. : 5,818,277
DATED : October 6, 1998
INVENTOR(S) : Miura

It is certified that error appears in the above-identified patent and that said Letters Patent is hereby corrected as shown below:

Title page, Col. 2, [57] "ABSTRACT", line 5, delete "11" (both occurrences).

Col. 4, line 46, change "Ti" to --$T_1$--.

Col. 6, line 18, delete "read from said counter";
line 32, delete "second"; (1st occurr.)
line 35, change "second counter" to --counter of said timer means--.

Signed and Sealed this

Twenty-third Day of March, 1999

Attest:

Q. TODD DICKINSON

*Attesting Officer*  *Acting Commissioner of Patents and Trademarks*